United States Patent
Yamada et al.

(10) Patent No.: US 9,837,630 B2
(45) Date of Patent: Dec. 5, 2017

(54) ORGANIC EL ELEMENT AND ORGANIC EL ELEMENT MANUFACTURING METHOD HAVING AN AUXILIARY ELECTRODE INCLUDES A LINEAR PORTION AND A CURVED PORTION

(71) Applicant: PANASONIC INTELLECTUAL PROPERTY MANAGEMENT CO., LTD., Osaka (JP)

(72) Inventors: Tomonori Yamada, Tokyo (JP); Narimasa Iwamoto, Mie (JP); Tsutomu Ichihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/318,763

(22) PCT Filed: Jul. 6, 2015

(86) PCT No.: PCT/JP2015/003387
§ 371 (c)(1),
(2) Date: Dec. 14, 2016

(87) PCT Pub. No.: WO2016/017072
PCT Pub. Date: Feb. 4, 2016

(65) Prior Publication Data
US 2017/0125724 A1 May 4, 2017

(30) Foreign Application Priority Data
Jul. 30, 2014 (JP) .................. 2014-155276

(51) Int. Cl.
*H01L 27/32* (2006.01)
*H01L 51/52* (2006.01)
(Continued)

(52) U.S. Cl.
CPC ...... *H01L 51/5212* (2013.01); *H01L 51/0022* (2013.01); *H01L 51/0096* (2013.01);
(Continued)

(58) Field of Classification Search
CPC . H01L 27/32; H01L 27/3251; H01L 2227/32; H01L 2924/12044; H01L 51/50
See application file for complete search history.

(56) References Cited

U.S. PATENT DOCUMENTS

| | | |
|---|---|---|
| 2009/0133922 A1 | 5/2009 | Okazaki et al. |
| 2010/0308715 A1 | 12/2010 | Chou et al. |
| 2017/0110683 A1* | 4/2017 | Koresawa ........... H01L 51/5246 |

FOREIGN PATENT DOCUMENTS

| | | |
|---|---|---|
| JP | 2009-134958 | 6/2009 |
| JP | 2010-205432 | 9/2010 |

(Continued)

OTHER PUBLICATIONS

International Search Report for International Patent Application No. PCT/JP2015/003387, dated Sep. 29, 2015, along with English-language translation thereof.

*Primary Examiner* — Hoai V Pham
(74) *Attorney, Agent, or Firm* — Greenblum & Bernstein, P.L.C.

(57) ABSTRACT

An organic EL panel includes a first substrate, a first electrode disposed on the first substrate, an organic layer including a light emitting layer and disposed on the first electrode, a second electrode disposed on the organic layer, and an auxiliary electrode stacked on the first electrode. The auxiliary electrode includes a linear portion and a curved portion, and the curved portion has a greater line width than the linear portion.

7 Claims, 7 Drawing Sheets

(51) Int. Cl.
   *H01L 51/00*   (2006.01)
   *H01L 51/50*   (2006.01)
   *H01L 51/56*   (2006.01)

(52) U.S. Cl.
   CPC ...... *H01L 51/5012* (2013.01); *H01L 51/5221* (2013.01); *H01L 51/56* (2013.01)

(56) References Cited

FOREIGN PATENT DOCUMENTS

| | | |
|---|---:|---:|
| JP | 2010-225386 | 10/2010 |
| JP | 4613201 | 10/2010 |
| JP | 2012-041196 | 3/2012 |
| JP | 4981371 | 7/2012 |
| JP | 2014-032757 | 2/2014 |
| WO | 2006/088059 | 8/2006 |

* cited by examiner

ORGANIC EL ELEMENT AND ORGANIC EL ELEMENT MANUFACTURING METHOD HAVING AN AUXILIARY ELECTRODE INCLUDES A LINEAR PORTION AND A CURVED PORTION

TECHNICAL FIELD

The present invention relates to an organic electroluminescent (EL) element and an organic EL element manufacturing method.

BACKGROUND ART

Consideration is being given to applying organic EL elements, such as organic EL panels, as high-efficiency surface light sources to various types of devices. For example, applying organic EL elements to devices, such as lightning fixtures, displays, and windows, is being expected.

This type of organic EL element includes, for example, a translucent substrate, a transparent electrode made of, for example, indium tin oxide (ITO) and formed on the translucent substrate, an organic light emitting layer formed on the transparent electrode, and a reflecting electrode formed on the organic light emitting layer.

Transparent conductive materials such as ITO that are used as materials for transparent electrodes generally have high resistivity. Thus, if in the above organic EL element, voltage is applied from an electrode terminal portion (extraction electrode) provided in the peripheral portion to the transparent electrode (ITO), light emission luminance in the central region of the light emitting surface, which is far from the electrode terminal portion, decreases due to a voltage drop across the transparent electrode. As a result, unevenness in luminance occurs at the light emitting surface of the organic EL element.

In view of this, technology is known in which a thin linear auxiliary electrode made of a low-resistance material, such as a metal, is formed in a grid-like pattern on the transparent electrode so as to suppress unevenness in the luminance of the light emitting surface, which is caused by a voltage drop across the transparent electrode (e.g., Patent Literature (PTL) 1).

CITATION LIST

Patent Literature

[PTL 1]
Japanese Patent Publication No. 4981371

SUMMARY OF INVENTION

Technical Problem

Such a conventional pattern of the auxiliary electrode, however, cannot sufficiently suppress unevenness in the luminance of the light emitting surface.

The present invention has an object of providing an organic EL element that can sufficiently suppress unevenness in the luminance of the light emitting surface.

Solution to Problem

To achieve the object stated above, an embodiment of the organic EL element according to the present invention includes a substrate, a first electrode disposed on the substrate, an organic layer including a light emitting layer and disposed on the first electrode, a second electrode disposed on the organic layer, and an auxiliary electrode stacked on the first electrode. The auxiliary electrode includes a linear portion and a curved portion, and the curved portion has a greater line width than the linear portion.

To achieve the object stated above, an embodiment of the organic EL element manufacturing method according to the present invention includes forming a first electrode on a substrate, stacking an auxiliary electrode on the first electrode, the auxiliary electrode including a linear portion and a curved portion, forming an organic layer on the first electrode, the organic layer including a light emitting layer, and forming a second electrode on the organic layer. In the forming of the auxiliary electrode, a liquid conductive material is applied so that the curved portion has a greater line width than the linear portion.

Advantageous Effects of Invention

Unevenness in the luminance of the light emitting surface can be sufficiently suppressed.

DESCRIPTION OF EMBODIMENTS

Figure 1A:
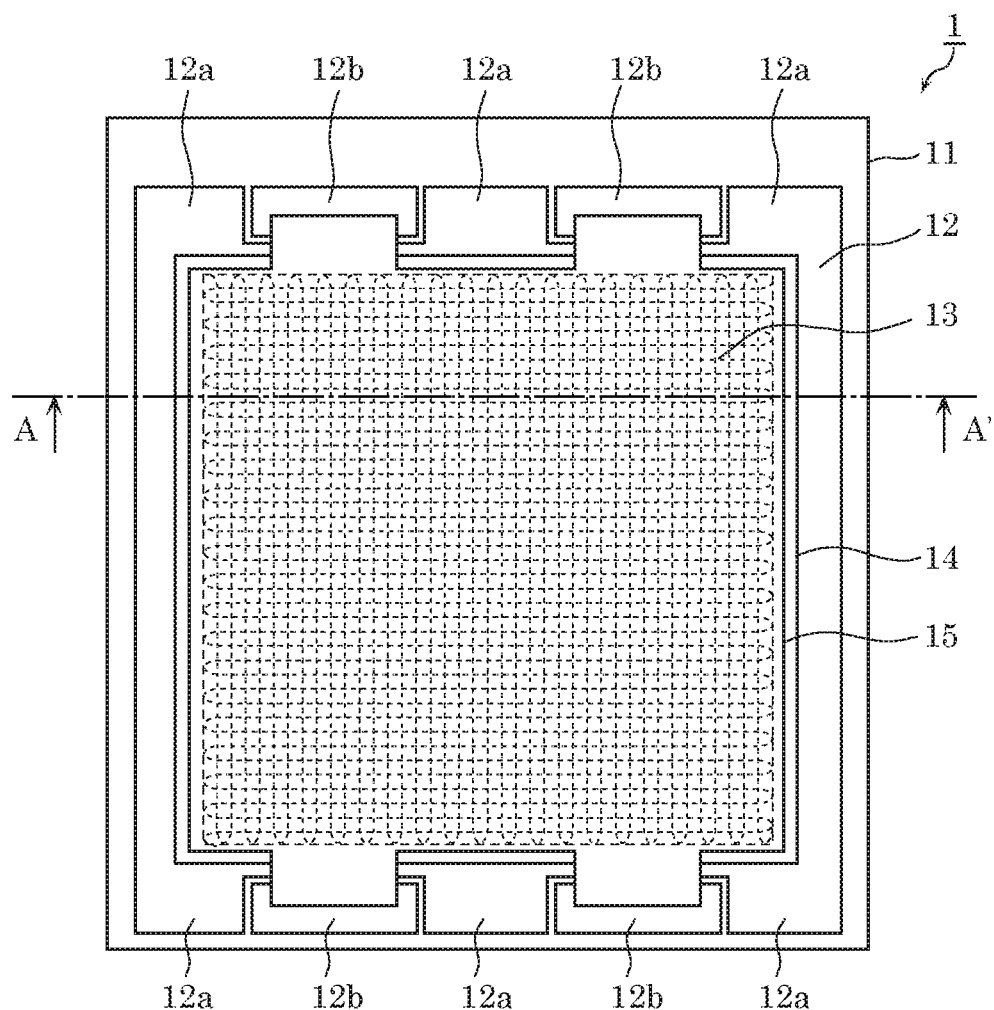
FIG. 1A is a plan view of an organic EL panel according to an embodiment.

The following describes embodiments of the present invention with reference to drawings. Each embodiment described below shows a preferable specific example of the present invention. Thus, numerical values, shapes, materials, constituent elements, arrangement and connection of the constituent elements, steps, the order of steps, and others given in the following embodiments are mere examples, and do not limit the present invention. Among the constituent elements of embodiments described below, those that are not recited in any one of the independent claims, which represent the broadest concepts of the present invention, are described as optional constituent elements.

Note that each drawing is schematic and does not necessarily provide precise depiction. Constituent elements that are substantially the same are given the same reference numerals throughout the drawings, and their detailed description is omitted or simplified.

In the specification, for the sake of convenience, the up-down direction in each drawing is assumed to be a longitudinal direction, and the right-left direction is assumed to be a lateral direction.

[Organic EL Panel]

A configuration of organic EL panel 1 according to an embodiment will now be described with reference to FIGS. 1A and 1B. FIG. 1A is a plan view of the organic EL panel according to the embodiment, and FIG. 1B is a cross-sectional view of the organic EL panel taken along line A-A'.

Organic EL panel 1 is one example of organic EL elements and is a surface-emission type light emitting device that emits light of a predetermined color. For example, organic EL panel 1 emits white light.

Figure 1B:
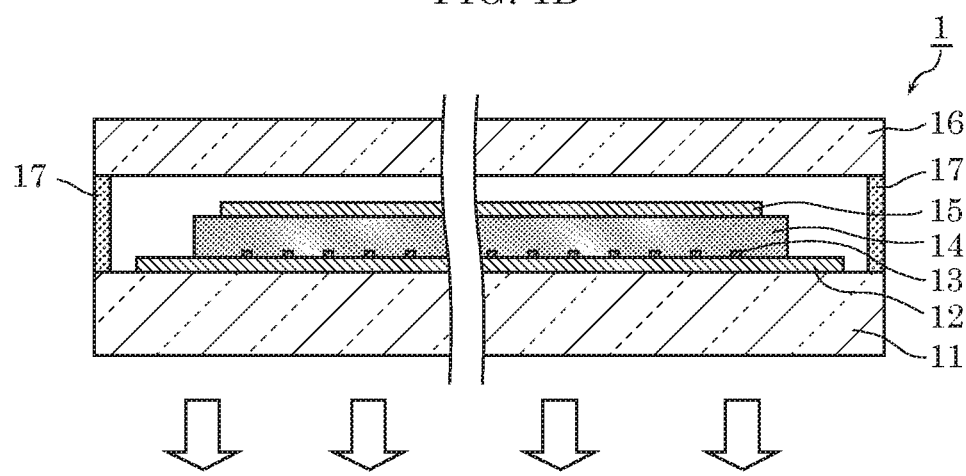
FIG. 1B is a cross-sectional view of the organic EL panel according to the embodiment.

As illustrated in FIGS. 1A and 1B, organic EL panel 1 includes first substrate 11, first electrode 12, auxiliary electrode (auxiliary line) 13, organic layer 14 including a light emitting layer, second electrode 15, second substrate 16, and sealing resin 17.

In the present embodiment, first substrate 11 and first electrode 12 have translucency, and second electrode 15 has reflecting properties. That is, organic EL panel 1 of the present embodiment is a single-sided light emission type organic EL element that has a light emitting surface on only one side (surface on first substrate 11 side) and emits light from only this light emitting surface, as illustrated in FIG. 1B.

Alternatively, organic EL panel 1 may be a double-sided light emission type organic EL element that includes second electrode 15 and second substrate 16, both having translucency, and emits light from both surfaces of first substrate 11 and second substrate 16. The term "translucency (optical permeability)" as used in the specification refers to a light transmission property of a substance and is a concept that includes transparency.

The following describes the details of each constituent member of organic EL panel 1 according to the present embodiment.

First substrate 11 is a translucent substrate having translucency. For example, first substrate 1 may be a glass substrate made of a glass material, or a resin substrate made of a translucent resin material such as a polycarbonate resin, an acrylic resin, or a polyester resin.

First substrate 11 is a base substrate and arranged on the light emission side. Examples of first substrate 11 include a transparent glass substrate made of glass, and a transparent substrate such as a transparent resin substrate having excellent resistance to moisture permeability, such as a polyester resin.

In the present embodiment, first substrate 11 is a transparent substrate having high transmittance to such a degree that the opposite side can be seen through the substrate. First substrate 11 is, for example, a transparent glass substrate. Using a glass substrate as first substrate 11 suppresses the entry of moisture into the interior of organic EL panel 1 because glass has low moisture permeability.

First substrate 11 may be made of a composite material that includes glass and materials other than glass. For example, first substrate 11 may have a stacked structure of a glass plate and a resin layer (light extraction layer) having light extraction properties. This improves light extraction efficiency of organic EL panel 1. In this case, for example, the resin layer is provided on the surface of the glass plate on first electrode 12 side. The resin layer having light extraction properties may be a layer having a structure that permits light scattering, and attached to the glass plate. The resin layer may be made of a plastic material. Examples of the plastic material include a polyethylene terephthalate (PET) resin, a polyethylene naphthalate (PEN) resin, an acrylic resin, and an epoxy resin. As another alternative, the resin layer may have a multilayer structure that includes a high refractive index layer and a low refractive index layer having a lower refractive index than the high refractive index layer. In addition, a fine uneven structure may be formed at the interface between the high refractive index layer and the low refractive index layer.

Note that first substrate 11 is not limited to a rigid substrate, and may be a flexible substrate having flexibility, such as a flexible resin substrate or a flexible glass substrate. First substrate 11 has, for example, a square or rectangular shape, but the present invention is not limited to this example. First substrate 11 may have a circular shape or a polygonal shape other than a quadrangle. First substrate 11 is colorless and transparent, but may be somewhat colored or semi-transparent. One example of semi-transparent first substrate 11 is a ground glass substrate.

As illustrated in FIG. 1B, first electrode 12 is disposed on first substrate 11. For example, first electrode 12 is formed in a predetermined shape on the upper surface of first substrate 11. In the present embodiment, first electrode 12 has a substantially rectangular main part that corresponds to organic layer 14 in a plan view, and further has a plurality of (in FIG. 1A, three) protrusions that extend toward each of two sides (top and bottom) of rectangular first substrate 11, as illustrated in FIG. 1A.

The protrusions of first electrode 12 are first electrode terminal portions 12a of first electrode 12. Note that first substrate 11 include rectangular second electrode terminal portions 12b that are made of the same material as first electrode 12. First electrode terminal portions 12a are power supply parts to which a predetermined voltage to be supplied to first electrode 12 is applied, and second electrode terminal portions 12b are power supply parts to which a predetermined voltage to be supplied to second electrode 15 is applied. Second electrode terminal portions 12b are not connected to first electrode 12 and separated from first electrode terminal portions 12a.

First electrode 12 is an electrode having translucency and made of a material having both conductivity and translucency. Examples of the material for first electrode 12 include conductive transparent metal oxides such as ITO, indium zinc oxide (IZO), and AZO (Al-added ZnO). First electrode 12 of the present embodiment is a transparent electrode made of a transparent conductive film (ITO film) including ITO and is deposited by, for example, sputtering.

In this way, first electrode 12 has translucency. Thus, light that is generated at the light emitting layer of organic layer 14 and travels toward first substrate 11 can pass through first electrode 12. In the present embodiment, first electrode 12 serves as an anode.

First electrode 12 has a thickness of, for example, 10 nm to 1000 nm. In particular, if the thickness of first electrode 12 is in the range of 50 nm to 1000 nm, first electrode 12 can ensure excellent translucency and conductivity. From the viewpoint of light transmittance, first electrode 12 more preferably has a thickness of 30 nm to 300 nm.

Auxiliary electrode 13 is stacked on first electrode 12. In the present embodiment, auxiliary electrode 13 is formed on first electrode 12 as illustrated in FIG. 1B. Stacking auxiliary electrode 13 on first electrode 12 suppresses unevenness in the luminance of the light emitting surface, which is caused by a voltage drop across first electrode 12. Specifically, because the transparent conductive material used for first electrode 12, such as ITO, generally has high resistivity, if voltage is applied from first electrode terminal portions 12a formed in the peripheral portion of first substrate 11 to first electrode 12, the luminance in the central region of the light emitting surface (organic layer 14) decreases due to a voltage drop across first electrode 12. In view of this, auxiliary electrode 13 is stacked on first electrode 12. This complements the conductivity of first electrode 12 and allows current to be uniformly distributed on the surface of first electrode 12, thereby suppressing a reduction in the luminance in the central region of the light emitting surface.

Auxiliary electrode 13 is made of a material having lower resistivity than first electrode 12. Examples of the material for auxiliary electrode 13 include a conductive material such as gold, silver, copper, aluminum, graphene, or carbon nanotube; and a mixture of these materials.

Auxiliary electrode 13 may be formed by vacuum processes (dry processes) such as vapor deposition or sputtering or by wet processes such as ink-jetting or screen printing. In the present embodiment, auxiliary electrode 13 is formed by wet processes.

More specifically, auxiliary electrode 13 is formed by ejection of a liquid made of a liquid conductive material, e.g., applying a liquid conductive material (conductive paste) that has high conductivity and that can be ejected in the form of liquid, examples of which include metals such as silver and copper and alloys of these metals.

As illustrated in FIG. 1A, auxiliary electrode 13 is formed in a predetermined pattern. More specifically, the liquid conductive material is applied in a predetermined pattern. The details of the pattern shape of auxiliary electrode 13 will be described later.

Organic layer 14 is disposed on first electrode 12 as illustrated in FIG. 1B. More specifically, organic layer 14 is disposed on first electrode 12 to cover auxiliary electrode 13. Organic layer 14 is located between first electrode 12 and second electrode 15.

Organic layer 14 is an organic EL layer (organic light emitting layer) that includes at least a light emitting layer containing an organic compound, which is a light emitting substance. Besides the light emitting layer, organic layer 14 may further include one or more functional layers selected from among the group of a hole injection layer, a hole transfer layer, an electron transfer layer, an electron injection layer, and an intermediate layer. For example, if first electrode 12 serves as an anode and second electrode 15 serves as a cathode as in the present embodiment, organic layer 14 may have a stacked structure that includes a hole injection layer, a hole transfer layer, a light emitting layer, an electron transfer layer, and an electron injection layer in this order from first electrode 12 side to second electrode 15 side.

For example, organic layer 14 is made of a predetermined organic material and formed on first electrode 12 by processes such as vapor deposition or liquid coating. Organic layer 14 has a thickness of, for example, 60 nm to 300 nm. The functional layers of organic layer 14 are made primarily of organic materials, but some of the functional layers may be made of inorganic materials. Alternatively, organic layer 14 may have a so-called multiunit structure.

Second electrode 15 is disposed on organic layer 14. For example, second electrode 15 is formed in a predetermined shape on the surface of organic layer 14. In the present embodiment, second electrode 15 has a plurality of (in FIG. 1A, two) protrusions that extend toward each of two sides (top and bottom) of first substrate 11. The protrusions of second electrode 15 are connected to second electrode terminal portions 12b of first substrate 11.

Second electrode 15 is an electrode having reflecting properties and made of a material having both conductivity and reflecting properties. That is, second electrode 15 of the present embodiment is a reflecting electrode having reflecting properties. Examples of the material for second electrode 15 include metal materials such as silver, aluminum, and copper. Second electrode 15 is deposited by processes such as vapor deposition or sputtering. Second electrode 15 has a thickness of, for example, 10 nm to 1000 nm.

In this way, second electrode 15 has reflecting properties. Thus, light that is generated at the light emitting layer of organic layer 14 and travels toward second substrate 16 is reflected by second electrode 15 and travels toward first substrate 11. As described above, second electrode 15 of the present embodiment serves as a cathode.

Second substrate 16 is a cap substrate that covers first electrode 12, organic layer 14, and second electrode 15, and may be either a translucent substrate or a non-translucent substrate. Second substrate 16 may be a substrate made of the same material and the same shape as first substrate 11. For example, second substrate 16 may be a rectangular glass substrate (cap glass).

Sealing resin 17 is a sealer that seals first substrate 11 and second substrate 16. Sealing resin 17b is formed in a flame-like shape along the peripheral edges of first substrate 11 and second substrate 16 so as to surround a stacked structure of first electrode 12, organic layer 14, and second electrode 15. Note that a solid drying agent may be disposed in the gap between second electrode 15 and second substrate 16, or the gap between second electrode 15 and second substrate 16 may be filled with a filler.

Organic EL panel 1 with this configuration is electrically connected to a power supply circuit (not shown) and emits light. More specifically, first electrode terminal portions 12a and second electrode terminal portions 12b are electrically connected to the power supply circuit. When the power supply circuit supplies power and a predetermined voltage is applied between first electrode 12 and second electrode 15, current flows through organic layer 14 and causes the light emitting layer to emit light.

Figure 2:
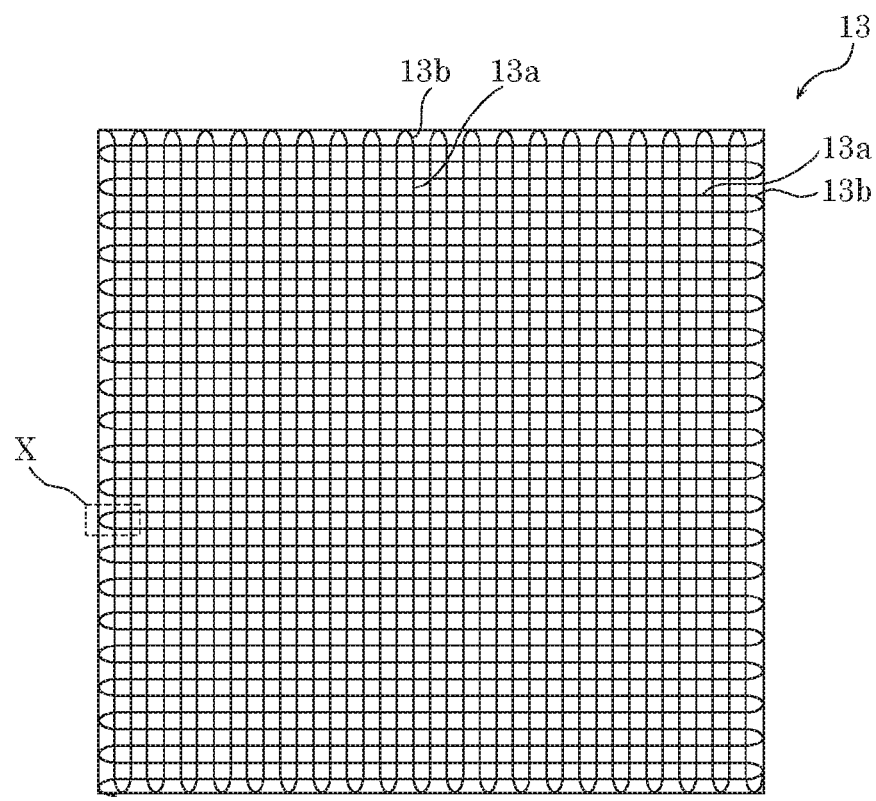
FIG. 2 illustrates a first pattern of an auxiliary electrode of the organic EL panel according to the embodiment.

Next, a detailed configuration of auxiliary electrode 13 will be described with reference to FIGS. 2 and 3. FIG. 2 is a plan view illustrating a pattern of the auxiliary electrode of the organic EL panel according to the embodiment, and FIG. 3 is an enlarged view of region X enclosed by the broken line in FIG. 2.

Figure 3:
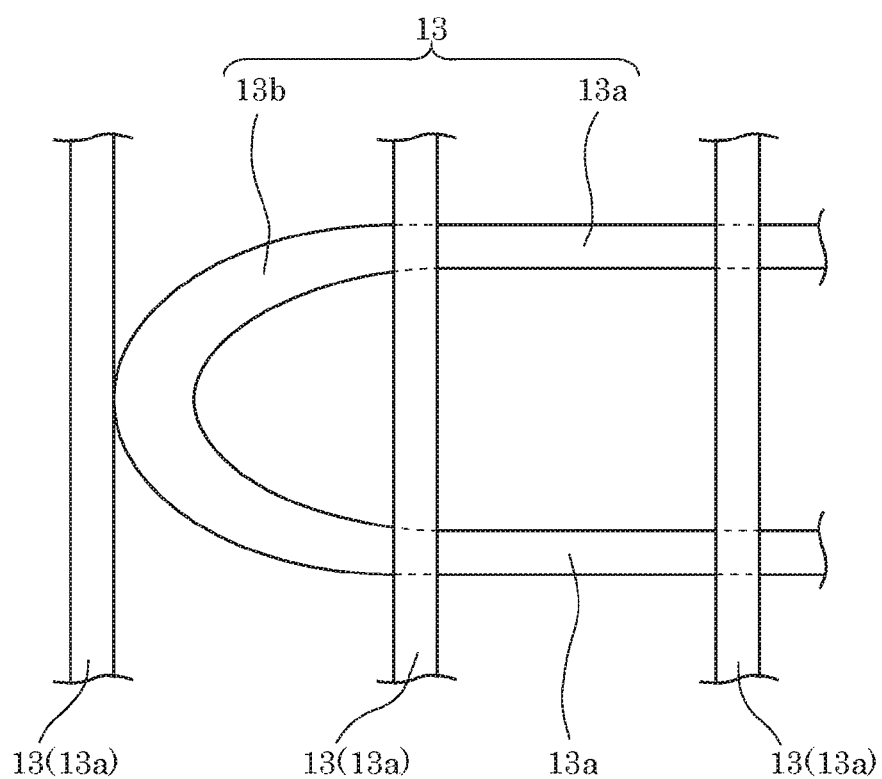
FIG. 3 is an enlarged view of region X in FIG. 2.

As illustrated in FIGS. 2 and 3, auxiliary electrode 13 has a pattern that includes linear portions 13a and curved portions 13b in a plan view. More specifically, auxiliary electrode 13 is a line electrode that is formed in a predetermined pattern in a predetermine rectangular region. Too large line width of auxiliary electrode 13 will inhibit light emission, and therefore auxiliary electrode 13 preferably has a line width of 1 μm to 100 μm and a thickness (height) of 0.1 μm to 10 μm in order to achieve both conductivity and less visibility. More preferably, auxiliary electrode 13 has a line width of 5 μm to 50 μm and a thickness of 0.5 μm to 2 μm.

As illustrated in FIG. 2, auxiliary electrode 13 of the present embodiment is formed in a substantially grid-like pattern across the entire rectangular region at a predetermined interval (line pitch) in each of the up-down direction (longitudinal direction) and the right-left direction (lateral direction). In the present embodiment, the up-down direction and the right-left direction have the same interval.

Linear portions 13a of auxiliary electrode 13 are formed in the internal region (region other than the peripheral region), i.e., main region, of the rectangular region. A plurality of linear portions 13a are formed in the up-down direction and the right-left direction. Linear portions 13a cover the first electrode 12 as a whole, excluding the peripheral edge, as illustrated in FIG. 1A. In the present embodiment, linear portions 13a have a constant line width.

Curved portions 13b of auxiliary electrode 13 are formed in the peripheral region of the rectangular region. Curved portions 13b are formed in a region between the outermost electrode (frame portion) at the top, bottom, left, and right of auxiliary electrode 13 and the electrode immediately on the inner side of the outermost electrode. Thus, curved portions 13b are formed in proximity to the peripheral edge of first electrode 12 as illustrated in FIG. 1A.

Each curved portion 13b is formed at each end of each linear portion 13a formed in the up-down direction (or the right-left direction). Each curved portion 13b is formed to connect the ends of two adjacent linear portions 13a.

As illustrated in FIG. 3, each curved portion 13b is formed in a curved pattern. More specifically, the pattern of curved portion 13b may have a substantially semi-circular arc shape, a substantially semi-oval arc-shape, or a parabolic shape, but is not limited to these examples.

Curved portions 13b of auxiliary electrode 13 have a larger line width than linear portions 13a. More specifically, the line width of each curved portion 13b gradually increases from the end of one of two adjacent linear portions 13a to the center of curved portion 13b and gradually decreases from the center of curved portion 13b to the end of the other adjacent linear portion 13a. That is, curved portions 13b of the present embodiment have the largest line width in their centers (U-turn portions) that are bent regions.

In the present embodiment, the line width of auxiliary electrode 13 increases continuously from linear portions 13a to curved portions 13b. That is, auxiliary electrode 13 is a continuous line of continuously formed linear portions 13a and curved portions 13b. Linear portions 13a and curved portions 13b have the same line width at their connections.

In the present embodiment, the line width of the entire curved portions 13b is larger than the line width of linear portions 13a, but the present invention is not limited to this example. For example, the line width of some part of curved portions 13b may be smaller than the line width of linear portions 13a.

Too large line width of auxiliary electrode 13 will inhibit light emission of organic EL panel 1. Thus, auxiliary electrode 13 preferably has a line width of 1 µm to 100 µm and a thickness of 0.1 µm to 10 µm in order to achieve both conductivity and less visibility. More preferably, auxiliary electrode 13 has a line width of 5 µm to 50 µm and a thickness of 0.5 µm to 2 µm.

[Method of Manufacturing Organic EL Panel]

The following describes the method of manufacturing organic EL panel 1 according to the present embodiment with reference to FIGS. 4A to 4D. FIGS. 4A to 4D are plan views illustrating each step in the method of manufacturing an organic EL panel according to the embodiment.

Figure 4A:
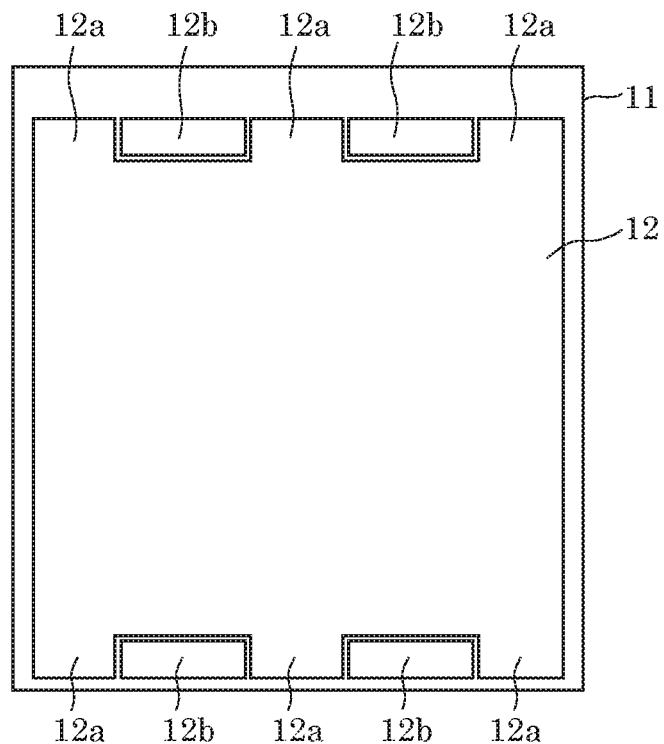
FIG. 4A is a plan view illustrating a step of forming a first electrode in a method of manufacturing an organic EL panel according to an embodiment.

First, first electrode 12 is formed on first substrate 11 as illustrated in FIG. 4A (step of forming first electrode). For example, a glass substrate is prepared as first substrate 11, and an ITO film having a predetermined shape is formed as first electrode 12 on the glass substrate. This step also involves forming first electrode terminal portions 12a and second electrode terminal portions 12b simultaneously with first electrode 12 at the time of patterning the ITO film, in this case, first electrode terminal portions 12a are formed integrally with first electrode 12, and second electrode terminal portions 12b are formed separately from first electrode terminal portions 12a and first electrode 12.

Figure 4B:
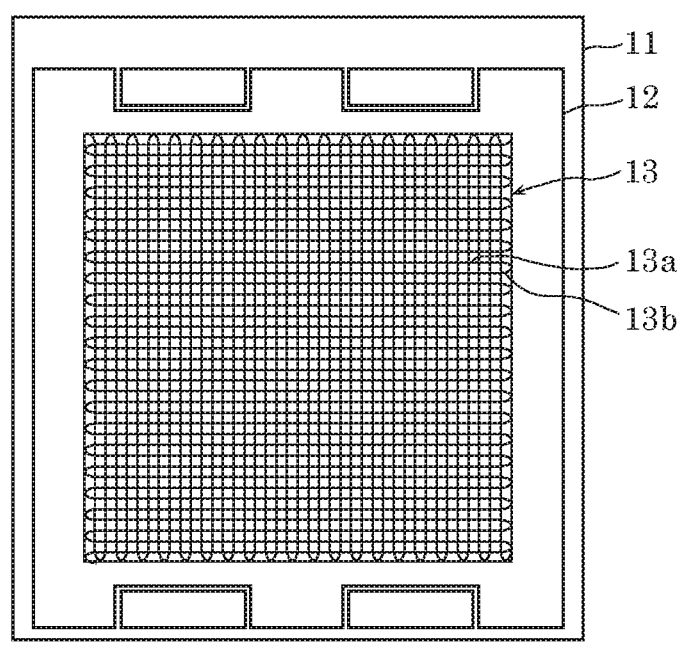
FIG. 4B is a plan view illustrating a step of forming an auxiliary electrode in the method of manufacturing an organic EL, panel according to the embodiment.

Next, auxiliary electrode 13 is formed and stacked on first electrode 12 (step of forming an auxiliary electrode). In the present embodiment, auxiliary electrode 13 is formed in a predetermined pattern on first electrode 12 as illustrated in FIG. 4B.

In the step of forming an auxiliary electrode, for example, a liquid conductive material is applied in a predetermined pattern to first electrode 12 by ejection of a liquid from an inkjet apparatus. More specifically, the liquid conductive material is applied such that auxiliary electrode 13 includes linear portions 13a and curved portions 13b, with curved portions 13b having a greater line width than linear portions 13a.

The liquid conductive material may be a metal paste made by dispersing metal particles such as silver or copper into a solvent and a binder. In particular, when a nano-silver paste is used, auxiliary electrode 13 will have small specific resistance and extremely excellent conducting performance. The ejection of a liquid made of the liquid conductive material is implemented by, for example, an inkjet apparatus. The liquid conductive material is ejected from a dispenser nozzle of the inkjet apparatus.

Figure 5:
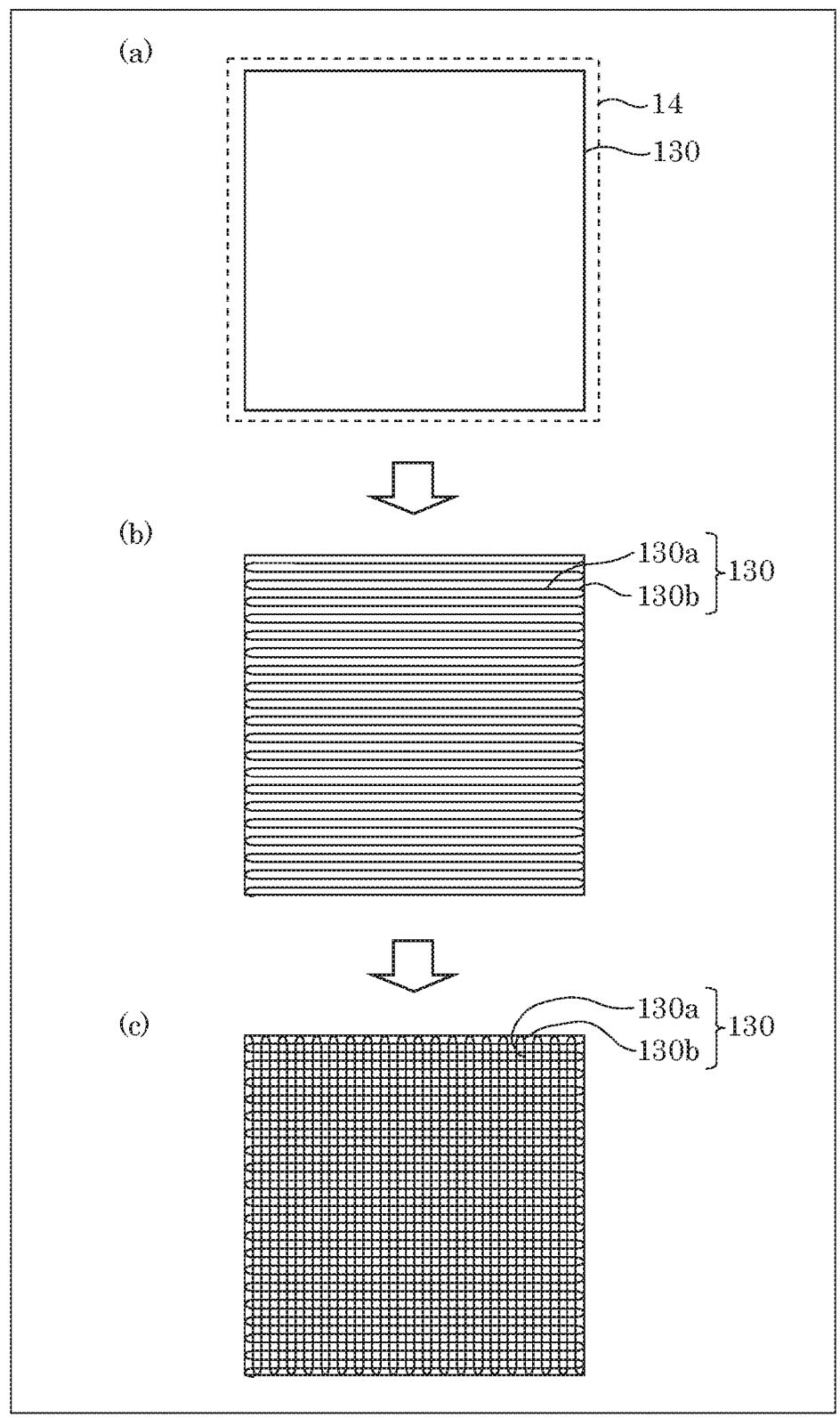
FIG. 5 illustrates an example of the order of application of conductive materials in the step of forming an auxiliary electrode.

In the step of applying the liquid conductive material, the liquid conductive material is directly written in a predetermined linear pattern on first electrode 12 by moving either the dispenser nozzle or first substrate 11 relative to the other in a predetermined direction. For example, the pattern of auxiliary electrode 13 illustrated in FIG. 4B is obtained by applying liquid conductive material 130 as illustrated in FIG. 5. FIG. 5 illustrates an example of the order of application of the liquid conductive material.

First, as illustrated in (a) in FIG. 5, first substrate 11 or the dispenser nozzle is moved so as to apply liquid conductive material 130 in a rectangular frame shape within a region that severs as a rectangular light emitting surface (organic layer 14).

Then, as illustrated in (b) in FIG. 5, liquid conductive material 130 is applied with a single stroke by moving first substrate 11 or the dispenser nozzle in a direction from the top end to the bottom end (or from the bottom end to the top end) while moving first substrate 11 or the dispenser nozzle repeatedly back and forth in the right-left direction. Accordingly, liquid conductive material 130 is applied so as to include repetitions of linear portions 130a extending in the right-left direction (corresponding to linear portions 13a) and curved portions 130b formed at both right and left ends (corresponding to curved portions 13b). In this case, linear portions 130a may be written by linearly moving the dispenser nozzle in the right-left direction, and curved portions 130b may be written by moving the dispenser nozzle in a curve.

Then, as illustrated in (c) in FIG. 5, liquid conductive material 130 is applied with a single stroke by moving first substrate 11 or the dispenser nozzle in a direction from the left end to the right end (or from the right end to the left end)

while moving first substrate 11 or the dispenser nozzle repeatedly back and forth in the up-down direction. Accordingly, liquid conductive material 130 is applied so as to include repetitions of linear portions 130*a* extending in the up-down direction (corresponding to linear portions 13*a*) and curved portions 130*b* formed at both top and bottom ends (corresponding to curved portions 13*b*). In this case, linear portions 130*a* may be written by linearly moving the dispenser nozzle in the up-down direction, and curved portions 130*b* may be written by moving the dispenser nozzle in a curve.

By applying conductive material 130 in this order, linear portions 130*a* extending in the right-left direction and linear portions 130*a* extending in the up-down direction become orthogonal to each other, and linear portions 130*a* extending in the up-down direction are overlaid on linear portions 130*a* extending in the right-left direction. Alternatively, the order of application in the up-down direction and the right-left direction may be reversed to apply conductive material 130 such that linear portions 130*a* extending in the right-left direction are overlaid on linear portions 130*a* extending in the up-down direction.

In the present embodiment, conductive material 130 is applied such that curved portions 130*b* have a greater line width than linear portions 130*a*.

In this case, for example, the writing speed (travel speed) of liquid conductive material 130 at the time of writing curved portions 130*b* may be reduced to less than the writing speed at the time of writing linear portions 130*a* so that the line width of curved portions 130*b* becomes greater than the line width of linear portions 130*a*. At this time, the amount of conductive material 130 ejected per unit of time may be the same or different between when writing linear portions 130*a* and when writing curved portions 130*b*.

Moreover, the line width of curved portions 130*b* may be gradually changed by gradually changing the writing speed of liquid conductive material 130 at the time of writing curved portions 130*b*. This provides curved portions 13*b* whose line width changes gradually as illustrated in, for example, FIG. 3.

Alternatively, the amount of conductive material 130 ejected at the time of writing curved portions 130*b* may be increased to greater than the amount of conductive material 130 ejected at the time of writing linear portions 130*a* so that the line width of curved portions 130*b* becomes greater than the line width of linear portions 130*a*. At this time, the writing speed of liquid conductive material 130 may be the same or different between when writing linear portions 130*a* and when writing curved portions 130*b*.

Moreover, the line width of curved portions 130*b* may also be gradually changed by gradually changing the amount of liquid conductive material 130 ejected at the time of writing curved portions 130*b*. With this technique, curved portions 130*b* can have a gradually changing line width.

After the application of conductive material 130 in a predetermined pattern, conductive material 130 is heated (heating step). For example, conductive material 130, which is a metal paste applied in a predetermined pattern, is fired at a predetermined temperature so as to volatilize components such as a solvent or a binder contained in the metal paste. As a result, liquid conductive material 130 solidifies, forming auxiliary electrode 13 having a predetermined pattern as illustrated in FIG. 4B.

Figure 4C:
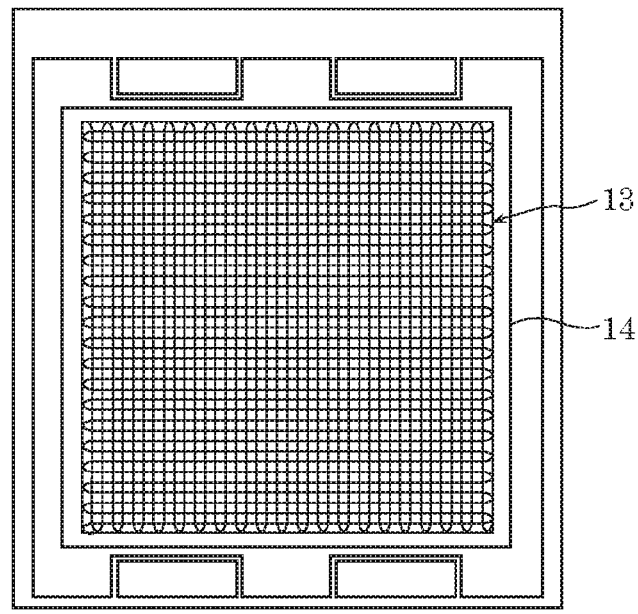
FIG. 4C is a plan view illustrating a step of forming an organic layer in the method of manufacturing an organic EL panel according to the embodiment.

Then, as illustrated in FIG. 4C, rectangular organic layer 14 is formed on first electrode 12 to cover auxiliary electrode 13. More specifically, a plurality of functional layers and a light emitting layer are sequentially formed by a method such as a method of application or vapor deposition.

Figure 4D:
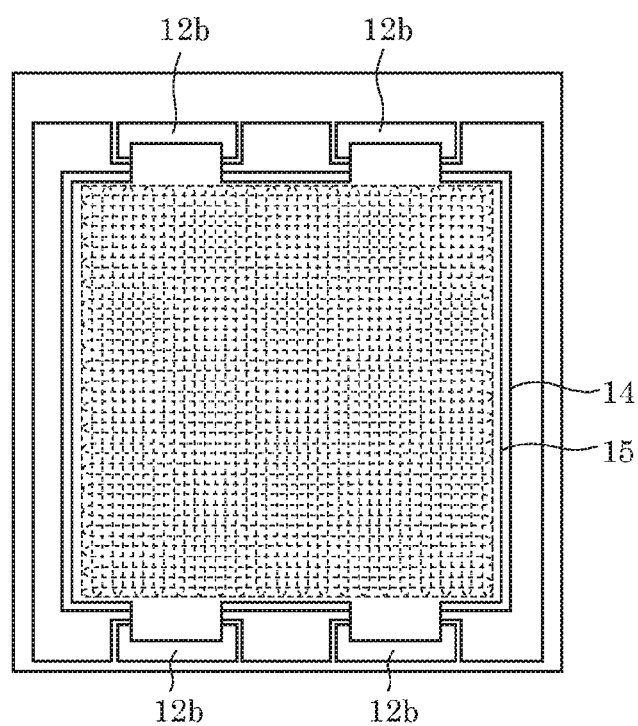
FIG. 4D is a plan view illustrating a step of forming a second electrode in the method of manufacturing an organic EL panel according to the embodiment.

Then, as illustrated in FIG. 4D, second electrode 15 is formed on organic layer 14. In the present embodiment, second electrode 15 is formed to partly protrude so that part of second electrode 15 is connected to second electrode terminal portions 12*b*.

Thereafter, although not shown, sealing resin 17 is applied in a frame shape along the peripheral edge of first substrate 11 so as to surround a stacked structure of first electrode 12, organic layer 14, and second electrode 15. Then, second substrate 16 is bonded to first substrate 11 via sealing resin 17. Sealing resin 17 is then cured. This completes the manufacture of organic EL panel 1.

Advantageous Effects

The following describes the advantageous effects of organic EL panel 1 according to the present embodiment, including how the present invention has been achieved.

In the field of organic EL panels, as described above, technology is known in which an auxiliary electrode is formed on a transparent electrode in order to suppress unevenness in the luminance of the light emitting surface. For example, PTL 1 describes forming an auxiliary electrode having a width of 50 μm or less in a grid intersecting pattern on a transparent electrode.

However, in some cases the auxiliary electrode having such a pattern cannot sufficiently suppress unevenness in luminance.

PTL 1 also describes partially increasing the line pitch of the auxiliary electrode so as to further reduce unevenness in the luminance of the light emitting surface. That is, PTL 1 describes forming an auxiliary electrode that includes regions with a large line pitch (coarse regions) and regions with a small line pitch (dense regions) to thereby further reduce unevenness in luminance.

However, if the line pitch of the auxiliary electrode is partly increased, coarseness of auxiliary lines at the light emitting surface will be visually recognized. Thus, problems arise such as inhibited light emission and undesirable outer appearance. In the case where the auxiliary electrode is formed by applying (writing) a liquid conductive material, there is also a problem in that the tact time increases if the line pitch of the auxiliary electrode is reduced.

The present invention has been conceived in view of such findings. The inventors of the present invention have found that unevenness in the luminance of the light emitting surface of an organic EL panel can be reduced by making improvements to the pattern of the auxiliary electrode of the organic EL panel without partly increasing the line pitch of the auxiliary electrode.

More specifically, in organic EL panel 1 of the present embodiment, auxiliary electrode 13 includes not only linear portions 13*a* but also curved portions 13*h*. This increases the area of auxiliary electrode 13 to greater than in the case where curved portions 13*b* are linear-shaped (in the case where the auxiliary electrode includes only linear portions). Accordingly, the area of contact between auxiliary electrode 13 and first electrode 12 increases.

In organic EL panel 1 of the present embodiment, auxiliary electrode 13 is further formed such that curved portions 13*b* have a greater line width than linear portions 13*a*. This further increases the area of auxiliary electrode 13 to greater than in the case where curved portions 13*b* and linear portions 13a have the same line width, thus further increasing the area of contact between auxiliary electrode 13 and first electrode 12.

In this way, in organic EL panel 1 of the present embodiment, auxiliary electrode 13 includes linear portions 13a and curved portions 13b, and curved portions 13b have a greater line width than linear portions 13a. This dramatically increases the area of contact between auxiliary electrode 13 and first electrode 12 to greater than in the case where curved portions 13b are linear-shaped. Thus, unevenness in luminance car be efficiently reduced across the entire light emitting surface of organic EL panel 1, and uniform luminance can be obtained at the light emitting surface without partly increasing the line pitch of auxiliary electrode 13.

In the present embodiment, the line width of auxiliary electrode 13 continuously increases from linear portions 13a to curved portions 13b. This continuous change in the line width of auxiliary electrode 13 suppresses unnatural change in appearance.

Examples of the cases where unevenness in luminance occurs at the light emitting surface of organic EL panel 1 include a case where the luminance in the peripheral portion of the light emitting surface becomes lower than the luminance in the central portion. This is because of the following reason. After the organic EL panel emits light (lights up), a temperature difference occurs between the peripheral portion and central portion of the light emitting surface of the organic EL panel. More specifically, the temperature in the peripheral portion of the organic EL panel becomes lower than the temperature in the central portion because heat dissipation is more likely to occur in the peripheral portion than in the central portion. In a temperature range that the organic EL panel is usually used, i.e., a temperature range in which materials are in their solid states, the organic layer has lower charge transfer characteristics and accordingly luminance decreases as the temperature decreases. As a result, the luminance in the peripheral portion of the light emitting surface may become lower than the luminance in the central portion of the light emitting surface. This phenomenon is likely to occur when a voltage drop across first electrode 12 is reduced by auxiliary electrode 13 or other factors, and will appear remarkably as the light emission area of the organic EL panel increases. Thus, this phenomenon becomes an issue in particular in the case of increasing the size of organic EL panels.

In view of this, in the present embodiment, curved portions 13b of auxiliary electrode 13 are formed in proximity to the peripheral edges of first electrode 12. This dramatically increases the area of contact between auxiliary electrode 13 and first electrode 12 in the peripheral portion of the light emitting surface when the luminance in the peripheral portion of the light emitting surface is lower than the luminance in the central portion of the light emitting surface, thereby suppressing a reduction in the luminance in the peripheral portion of the light emitting surface. Thus, unevenness in luminance can be reduced across the entire light emitting surface, and uniform luminance is obtained at the light emitting surface.

Figure 6:
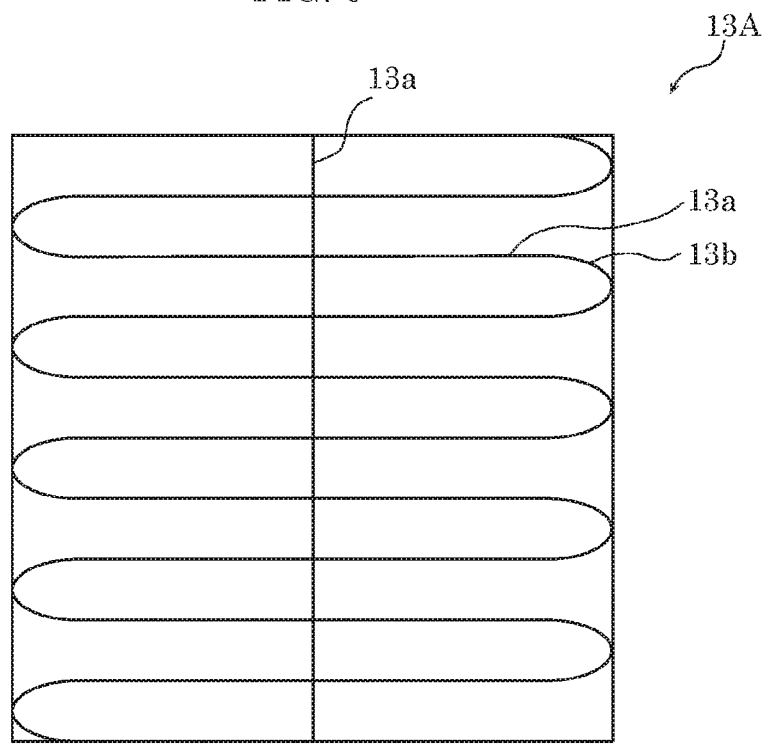
FIG. 6 illustrates a second pattern of the auxiliary electrode of the organic EL panel according to an embodiment.

The pattern of auxiliary electrode 13 is not limited to the pattern illustrated in FIG. 2. For example, auxiliary electrode 13A having a pattern illustrated in FIG. 6 may be formed. Like auxiliary electrode 13 illustrated in FIG. 2, auxiliary electrode 13A illustrated in FIG. 6 also includes curved portions 13b in proximity to the peripheral edges of first electrode 12. However, auxiliary electrode 13A illustrated in FIG. 6 include curved portions 13b at only right and left ends, and does not include curved portions 13b at top and bottom ends. Moreover, auxiliary electrode 13A illustrated in FIG. 6 has a greater interval (line pitch) of adjacent auxiliary electrodes 13 (linear portions 13a) than auxiliary electrode 13 illustrated in FIG. 2. Note that the pattern of auxiliary electrode 13A illustrated in FIG. 6 includes a rectangular portion of a rectangular frame shape and a single linear portion that extends in the up-down direction.

Examples of the cases where unevenness in luminance occurs at the light emitting surface of organic EL panel 1 also include a case where the luminance in the central portion of the light emitting surface becomes lower than the luminance in the peripheral portion. This is the case where a voltage drop across first electrode 12 (transparent electrode) has great influence and causes the luminance of light emission to decrease in the central region of the light emitting surface, which is far from first electrode terminal portions 12a. This phenomenon also remarkably appears as the light emission area of the organic EL panel increases, and therefore becomes an issue in particular in the case of increasing the size of organic EL panels.

Figure 7:
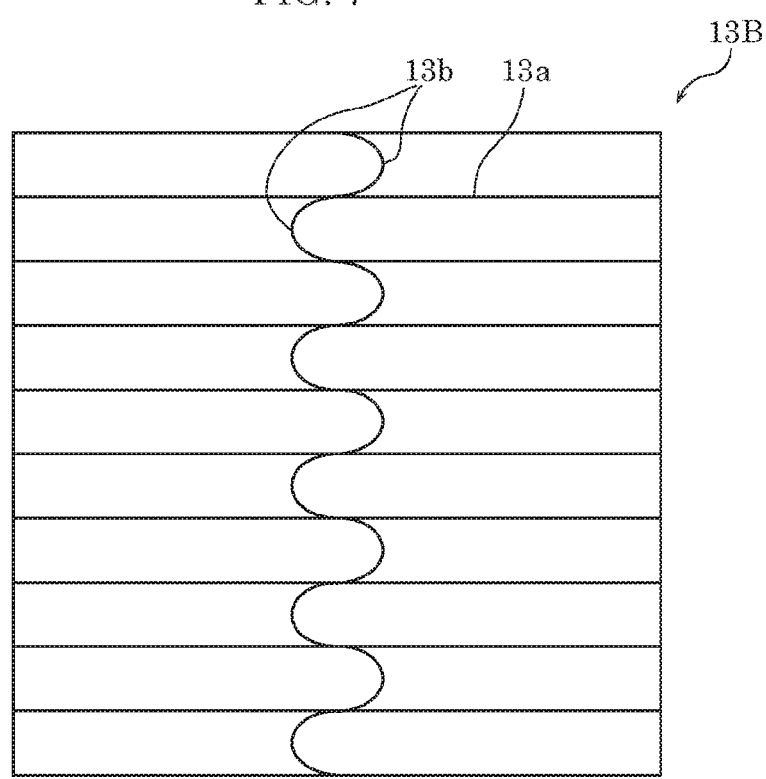
FIG. 7 illustrates a third pattern of the auxiliary electrode of the organic EL panel according to an embodiment.

In this case, for example, auxiliary electrode 13B having a pattern as illustrated in FIG. 7 may be formed. That is, curved portions 13b may be formed in the central portion of first electrode 12. This dramatically increases the area of contact between auxiliary electrode 13B and first electrode 12 in the central portion of the light emitting surface when the luminance in the central portion of the light emitting surface is lower than the luminance in the peripheral portion of the light emitting surface, thereby suppressing a reduction in luminance in the central portion of the light emitting surface. Accordingly, unevenness in luminance can be reduced across the entire light emitting surface, and uniform luminance can be obtained at the light emitting surface.

Auxiliary electrodes 13, 13A, and 13B according to the present embodiment are formed by applying liquid conductive material 130 so as to include linear portions 13a and curved portions 13b, with curved portions 13b having a greater line width than linear portions 13a.

Auxiliary electrodes 13, 13A, and 13B formed by applying liquid conductive material 130 in this way can suppress an increase in the tact time, as compared with auxiliary electrode 13 including only linear portions 13a.

In addition, the use of liquid conductive material 130 allows the pattern of conductive material 130 to be easily written such that curved portions 130b have a greater line width than linear portions 130a. For example, the line width of curved portions 130b can be easily increased to greater than the line width of linear portions 130a by reducing the writing speed of the dispenser nozzle at the time of writing curved portions 130b to less than the writing speed of the dispenser nozzle at the time of writing linear portions 130a, or by increasing the amount of conductive material 130 ejected at the time of writing curved portions 130b to greater than the amount of conductive material 130 ejected at the time of writing linear portions 130a.

Examples

The following describes the effect of suppressing unevenness in the luminance of the organic EL panel and the effect of reducing the tact time according to Examples 1 to 3 in which organic EL panel 1 described above was actually manufactured, and also describes the effect of suppressing unevenness in the luminance of the organic EL panel and the effect of reducing the tact time according to Comparative Examples 1 and 2.

The organic EL panel according to Example 1 was manufactured as follows.

First, first electrode 12 made of an ITO film having a thickness of 150 nm and a sheet resistance of approximately 10 Ω/sq. was formed by magnetron sputtering on first substrate 11 made of a glass substrate having a substrate thickness of 0.7 mm. First electrode 12 was then cleaned with isopropyl alcohol and deionized water.

Next, liquid conductive material 130 (e.g., nano-silver paste (NPS-J) manufactured by Harima Chemicals Group, Inc.) was ejected onto first electrode 12 (ITO film) by an inkjet apparatus while moving first substrate 11 at an average speed of 100 mm/s, thereby forming a pattern illustrated in (c) in FIG. 5. Note that liquid conductive material 130 was applied so as to have a line pitch of 2 mm or to include linear portions 130a having a line width of 20 μm and curved portions 130b having a maximum line width of 70 μm. The pattern was then fired at 300° C. for 60 minutes. Auxiliary electrode 13 having a pattern illustrated in FIG. 2 was formed with this method.

Next, organic layer 14 was formed on first electrode 12 and auxiliary electrode 13. More specifically, first, a hole transfer layer made of 4,4'-bis[N-(naphthyl)-N-phenyl-amino]biphenyl (α-NPD) was formed to a thickness of 50 nm on first electrode 12 so as to cover auxiliary electrode 13. Then, a light emitting layer made of tris(8-hydroxyquino-line) aluminum (Alq3) was formed to a thickness of 30 nm on the hole transfer layer. Then, an electron transfer layer made of BCP was formed to a thickness of 60 nm on the light emitting layer.

Next, second electrode 15 was formed on organic layer 14. More specifically, second electrode 15 made of an aluminum evaporated film was formed to a thickness of 100 nm on the electron transfer layer.

Note that the light emitting region (light emitting surface) of the organic EL panel of Example 1 is a square of 80 mm×80 mm.

The organic EL panel of Example 2 differs only in the pattern of the auxiliary electrode from the organic EL panel of Example 1. More specifically, the organic EL panel of Example 2 includes auxiliary electrode 13A having a pattern illustrated in FIG. 6. Auxiliary electrode 13A (conductive material 130) of Example 2 has a line pitch of 8 mm. Except the pattern of the auxiliary electrode, the organic EL panel of Example 2 is the same as the organic EL panel of Example 1.

The organic EL panel of Example 3 also differs only in the pattern of the auxiliary electrode from the organic EL panel of Example 1. More specifically, the organic EL panel of Example 3 includes auxiliary electrode 133 having a pattern illustrated in FIG. 7. Auxiliary electrode 13B (conductive material 130) of Example 3 has a line pitch of 8 mm. Except the pattern of the auxiliary electrode, the organic EL panel of Example 3 is the same as the organic EL panel of Example 1.

Figure 8:
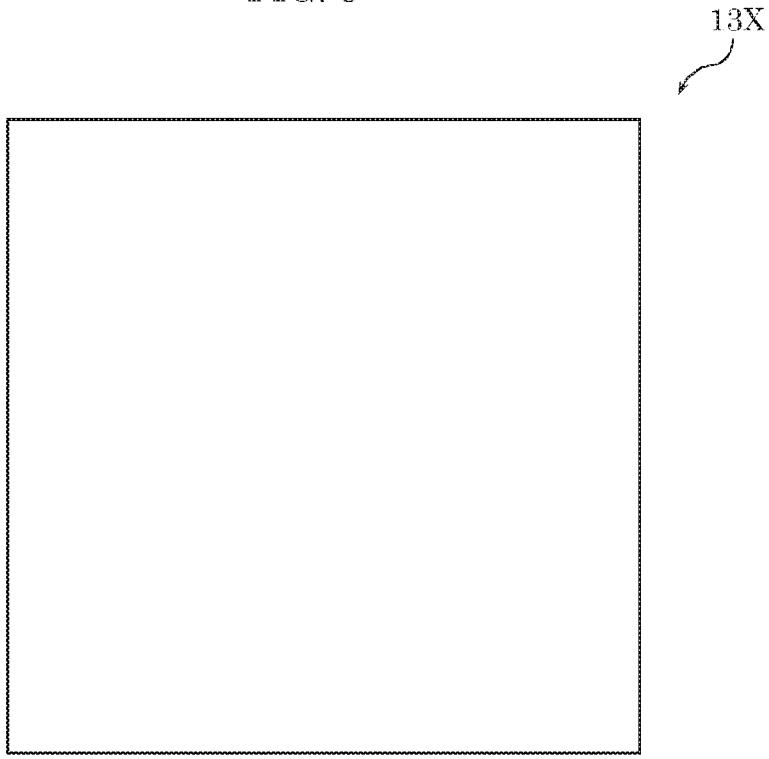
FIG. 8 illustrates a pattern of the auxiliary electrode of an organic EL panel according to a comparative example.

The organic EL panel of Comparative Example 1 also differs only in the pattern of the auxiliary electrode from the organic EL panel of Example 1. More specifically, the organic EL panel of Comparative Example 1 includes auxiliary electrode 13X having a pattern illustrated in FIG. 8. More specifically, the pattern of auxiliary electrode 13X has a shape including only the rectangular frame portion of the pattern of auxiliary electrode 13 illustrated in FIG. 2. Except the pattern of the auxiliary electrode, the organic EL panel of Comparative Example 1 is the same as the organic EL panel of Example 1.

Figure 9:
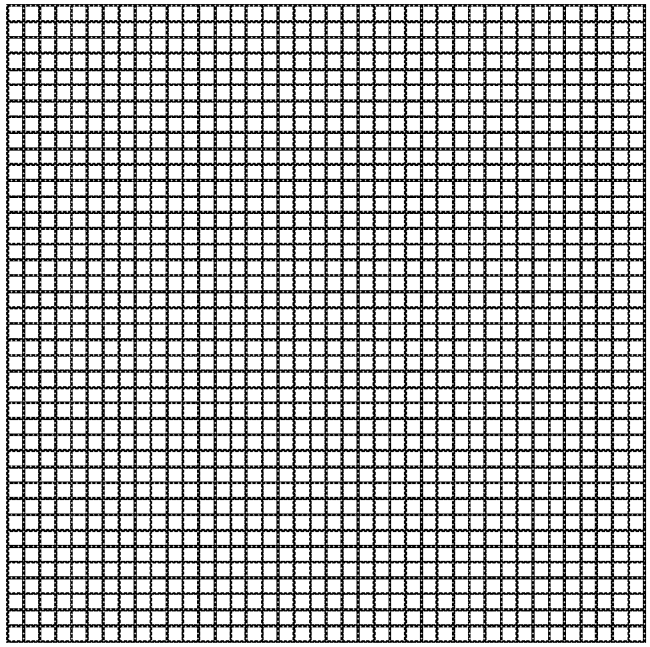
FIG. 9 illustrates another pattern of the auxiliary electrode of an organic EL panel according to a comparative example.

The organic EL panel of Comparative Example 2 also differs only in the pattern of the auxiliary electrode from the organic EL panel of Example 1. More specifically, the organic EL panel of Comparative Example 2 includes auxiliary electrode 13Y having a pattern illustrated in FIG. 9. More specifically, the pattern of auxiliary electrode 13Y has a shape including only a plurality of linear portions that intersect with one another in a grid. Auxiliary electrode 13Y of Comparative Example 2 has a line pitch of 2 mm, which is the same as in Example 1. Except the pattern of the auxiliary electrode, the organic EL panel of Comparative Example 2 is the same as the organic EL panel of Example 1.

Table 1 shows the results of the evaluation of unevenness in the luminance of the light emitting surface of each organic EL panel manufactured as described above. Note that the luminance of each organic EL panel was measured with a two-dimensional luminance meter. Numerical values indicating the level of unevenness in luminance are relative to one another, where a value of "5" indicates the highest level of unevenness in luminance and a value of "1" indicates the lowest level of unevenness in luminance. The term "low luminance portion" as used herein refers to a portion of the light emitting surface where the luminance is relatively low.

TABLE 1

|  | Level of Unevenness in Luminance | Low Luminance Portion |
|---|---|---|
| Example 1 | 1 | Peripheral Portion |
| Comparative Example 2 | 2 | Peripheral Portion |
| Example 3 | 3 | Central Portion |
| Example 2 | 4 | Central Portion |
| Comparative Example 1 | 5 | Central Portion |

As indicated by Table 1, the organic EL panel of Comparative Example 1 has the highest level of unevenness in luminance. Thus, it can be seen that the organic EL panels of Examples 1 to 3 can suppress unevenness in luminance more than the organic EL panel of Comparative Example 1. In particular, the organic EL panel of Example 1 can suppress unevenness in luminance more than any of the other organic EL panels.

The organic EL panels of Comparative Example 1 and Examples 2 and 3 have low luminance in the central portions of the light emitting surfaces. In the case of the organic EL panel of Comparative Example 1, this is because the auxiliary electrode was formed only in proximity to the peripheral edge of the light emitting surface and accordingly the current density in the central portion of the light emitting surface, which is far from the electrode terminal portion, became low. In the case of the organic EL panels of Examples 2 and 3, this is considered because the auxiliary electrode had a coarse line pitch of 8 mm and accordingly the current density in the central portion of the light emitting surface, which is far from the electrode terminal portion, could not increase sufficiently.

Comparison of the organic EL panels having low luminance in the central portion of the light emitting surface (organic EL panels of Comparative Example 1 and Examples 2 and 3) shows that the organic EL panels of Examples 2 and 3 can suppress unevenness in luminance more than the organic EL panel of Comparative Example 1.

The comparison also shows that the organic EL panel of Example 3 can suppress unevenness in luminance more than the organic EL panel of Example 2. This indicates that when the luminance in the central portion of the light emitting surface is low, auxiliary electrode 13 may be formed such that curved portions 13b are located in the central portion of first electrode 12.

The organic EL panels of Comparative Example 2 and Example 1 both have low luminance in the peripheral portion of the light emitting surface. This is considered because of the following reason, In the organic EL panels of Comparative Example 2 and Example 1, the auxiliary electrode had a dense line pitch of 2 mm and this is considered why the current density in the central portion of the light emitting surface became high and the central portion of the light emitting surface could emit light at relatively high intensity. It is, however, noted that the temperature in the peripheral portion of the light emitting surface easily drops due to the vicinity to the outside air, whereas the temperature in the central portion of the light emitting surface does not easily drop. Besides, as described above, the organic layer has lower charge transfer characteristics as the temperature decreases, and accordingly luminance decreases. This is also considered why the luminance in the peripheral portion of the light emitting surface decreased.

In this way, comparison of the organic EL panels having low luminance in the peripheral portion of the light emitting surface (organic EL panels of Comparative Example 2 and Example 1) shows that the organic EL panel of Example 1 can suppress unevenness in luminance more than the organic EL panel of Comparative Example 2. This indicates that when the luminance in the peripheral portion of the light emitting surface is low, auxiliary electrode 13 may be formed such that curved portions 13b are located in proximity to the peripheral edge of first electrode 12.

Next, Table 2 shows the tact time required to manufacture the auxiliary electrode of the organic EL panels of Examples 1 to 3 and the organic EL panels of Comparative Examples 1 and 2.

TABLE 2

| | Example 1 | Example 2 | Example 3 | Comparative Example 1 | Comparative Example 2 |
|---|---|---|---|---|---|
| Tact Time (Second) | 68 | 18 | 38 | 5 | 120 |

As indicated by Table 2, the tact times for the organic EL panels of Examples 1 to 3 are shorter than the tact time for the organic EL panel of Comparative Example 2. This is considered because, at the time of forming the auxiliary electrode, writing the liquid conductive material along a curve at each turn can suppress a reduction in writing speed more than in the case of writing the liquid conductive material along the right angle at each turn. In this way, the organic EL panels of Examples 1 to 3 can also achieve the effect of reducing the tact time.

[Variations]

While the foregoing description of the organic EL element and the organic EL element manufacturing method according to the present invention takes the example of organic EL panels, the present invention is not limited to the foregoing embodiment.

While the foregoing embodiment describes the case where auxiliary electrode 13 is stacked on first electrode 12 by forming auxiliary electrode 13 on first electrode 12, the present invention is not limited to this example. More specifically, auxiliary electrode 13 may be stacked on first electrode 12 by forming auxiliary electrode 13 on first substrate 11 and then forming first electrode 12 on first substrate 11.

The organic EL panels according to the foregoing embodiment may be implemented as lighting devices. For example, such a lighting device includes one of the organic EL panels according to the foregoing embodiment and a power supply circuit that supplies current to the organic EL panel. In this case, the lightning device may include a plurality of organic EL panels.

The organic EL panels according to the foregoing embodiment may be applied to other devices such as displays other than lighting devices.

The present invention also includes other variations obtained by applying various changes conceivable by a person skilled in the art to each embodiment, and variations obtained by any combinations of the constituent elements and functions of each embodiment without departing from the scope of the present invention.

The invention claimed is:

1. An organic electroluminescent (EL) element comprising:
   a substrate;
   a first electrode disposed on the substrate;
   an organic layer including a light emitting layer and disposed on the first electrode;
   a second electrode disposed on the organic layer; and
   an auxiliary electrode stacked on the first electrode,
   wherein the auxiliary electrode includes a linear portion and a curved portion, and
   the curved portion has a greater line width than the linear portion.

2. The organic EL element according to claim 1,
   wherein the curved portion is formed in proximity to a peripheral edge of the first electrode.

3. The organic EL element according to claim 1,
   wherein the curved portion is formed in a central portion of the first electrode.

4. The organic EL element according to claim 1,
   wherein the auxiliary electrode has a line width that continuously increases from the linear portion to the curved portion.

5. An organic EL element manufacturing method comprising:
   forming a first electrode on a substrate;
   stacking an auxiliary electrode on the first electrode, the auxiliary electrode including a linear portion and a curved portion;
   forming an organic layer on the first electrode, the organic layer including a light emitting layer; and
   forming a second electrode on the organic layer,
   wherein in the forming of the auxiliary electrode, a liquid conductive material is applied so that the curved portion has a greater line width than the linear portion.

6. The organic EL element manufacturing method according to claim 5,
   wherein the curved portion and the linear portion are written by ejecting the liquid conductive material from a nozzle, and
   a writing speed of the liquid conductive material when writing the curved portion is lower than a writing speed of the liquid conductive material when writing the linear portion.

7. The organic EL element manufacturing method according to claim 5, wherein the curved portion and the linear portion are written by ejecting the liquid conductive material from a nozzle, and
an amount of the liquid conductive material ejected when writing the curved portion is greater than an amount of the liquid conductive material ejected when writing the linear portion.

* * * * *